(12) United States Patent
Chung et al.

(10) Patent No.: US 6,406,967 B1
(45) Date of Patent: Jun. 18, 2002

(54) METHOD FOR MANUFACTURING CYLINDRICAL STORAGE ELECTRODE OF SEMICONDUCTOR DEVICE

(75) Inventors: Dae-hyuk Chung, Sungnam (KR); Chang-lyong Song, Suwon (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/632,583

(22) Filed: Aug. 7, 2000

(30) Foreign Application Priority Data

Aug. 6, 1999 (KR) .............................. 99-32313

(51) Int. Cl.[7] .............................. H01L 21/20
(52) U.S. Cl. .................. 438/381; 257/306; 438/396; 438/397
(58) Field of Search .................. 438/253, 381, 438/396, 397, FOR 220; 257/306; 361/313

(56) References Cited

U.S. PATENT DOCUMENTS

| | | | |
|---|---|---|---|
| 5,126,916 A | * | 6/1992 | Tseng .......................... 361/313 |
| 6,107,155 A | * | 8/2000 | Hsiao et al. ................. 438/397 |
| 6,162,680 A | * | 12/2000 | Lou ............................. 438/397 |
| 6,228,736 B1 | * | 5/2001 | Lee et al. .................... 438/396 |

* cited by examiner

*Primary Examiner*—Wael Fahmy
*Assistant Examiner*—William David Coleman
(74) *Attorney, Agent, or Firm*—Marger Johnson & McCollom, P.C.

(57) ABSTRACT

A method for manufacturing a cylindrical storage electrode of a semiconductor device includes forming a contact pad to be connected to an active region of a semiconductor substrate in an interlayer insulator film on the semiconductor substrate. Then, a silicon nitride layer as an etching stop layer is formed on the contact pad. Next, an insulating layer is formed on the silicon nitride layer. A portion of the surface of the silicon nitride layer is exposed by partially removing the insulating layer. Then, the exposed portion of the silicon nitride layer is removed using a wet etching process using a predetermined etchant to expose the surface of the contact pad. A conductive layer for a storage electrode is formed on the insulating layer and the surface of the exposed contact pad. Finally, a cylindrical storage electrode is completed by removing the upper portion of the conductive layer for a storage electrode, the insulating layer and the silicon nitride layer.

14 Claims, 5 Drawing Sheets

METHOD FOR MANUFACTURING CYLINDRICAL STORAGE ELECTRODE OF SEMICONDUCTOR DEVICE

BACKGROUND OF THE INVENTION

1. Field of the Invention

The present invention relates to a method for manufacturing a capacitor of a semiconductor device, and more particularly, to a method for manufacturing a cylindrical storage electrode of a semiconductor device.

2. Description of the Related Art

As semiconductor devices become more highly integrated, the pattern size becomes also smaller, resulting in a number of problems. Particularly, in highly-integrated semiconductor memory devices such as a dynamic random access memory (DRAM), the area occupied by a memory cell has been continuously reduced. Thus, it is necessary to improve memory cell characteristics to offset the reduced cell area. In DRAM devices, the memory cell characteristics depend on the capacitance of a cell capacitor constituting a memory cell. In other words, if the cell capacitance increases, the memory cell characteristics such as low-voltage characteristic and soft-error characteristics due to a particles can be improved. Since the cell capacitance is proportional to the surface area of a storage electrode of a capacitor, a highly efficient memory cell can be attained by increasing the surface area of the storage electrode. Therefore, in order to provide a storage electrode having an increased surface area within a limited area, three-dimensional storage electrodes, for example, a cylindrical storage electrode, have been proposed.

FIGS. 1 through 4 are cross-sectional views for illustrating a method for forming a conventional cylindrical storage electrode.

Referring to FIG. 1, an interlayer insulator film 120 is formed on a semiconductor substrate 100 having an active region 110 defined by isolation regions (not shown). Next, a predetermined photoresist layer pattern (not shown) is formed on the interlayer insulator film 120. Then the exposed portions of the interlayer insulator film 120 are etched using the photoresist layer pattern as an etching mask. Then, contact holes are formed to expose the active region 110 of the semiconductor substrate 100. Subsequently, a conductive layer 130 is formed to completely fill the contact holes.

Referring to FIG. 2, the resultant structure shown in FIG. 1 is planarized to form contact pads 130' completely buried in the interlayer insulator film 120. Conventionally, the planarization is performed by an etch-back process using a dry etching process on the resultant structure until the surfaces of the interlayer insulator film 120 are exposed. Here, the upper surfaces of the contact pads 130' formed according to the etch-back process are recessed because of an etching selectivity between the interlayer insulator film 120 such as a silicon oxide ($SiO_2$) layer, and the conductive layer (130 of FIG. 1) such as a polysilicon layer. Subsequently, a silicon nitride ($Si_3N_4$) layer 140 used as an etching stop layer is formed on the surfaces of the interlayer insulator film 120 and contact pads 130'. As described above, since the upper surfaces of the contact pads 130' are recessed, the silicon nitride layer 140 formed thereon is also recessed.

Next, referring to FIG. 3, an oxide layer 150 is formed on the silicon nitride layer 140. Then, a photoresist layer pattern (not shown) is formed on the oxide layer 150. Subsequently, the exposed portions of the oxide layer 150 are etched using the photoresist layer pattern as an etching mask. The etching stops at the silicon nitride layer 140 that is an etching stop layer. Then, openings which expose the surface of the silicon nitride layer 140 corresponding to the surfaces of the contact pads 130' are formed in the oxide layer 150. Next, in order to expose the contact pads 130', the exposed portions of the silicon nitride layer 140 are removed, conventionally by a dry etching process using plasma.

Referring to FIG. 4, since the drying etching process using plasma is isotropically performed, the surfaces of the contact pads 130' are partially exposed. Thus, when the etching is completed, a silicon nitride layer 140' partially remains in the form of spacers along the edges of the contact pads 130', which is indicated by "A" in FIG. 4. The portions of the silicon nitride layer 140' partially remain in the form of spacers and undesirably reduce the contact area between storage electrodes (not shown) and the contact pads 130'. In its worst case, the remaining portions of the silicon nitride layer 140' may prevent a contact between storage electrodes (not shown) and the contact pads 130', leading to device failure.

SUMMARY OF THE INVENTION

To solve the above problems, it is an objective of the present invention to provide a cylindrical storage electrode for a semiconductor device, which allows the storage electrode to contact a pad oxide layer by completely removing the exposed portion of a silicon nitride layer formed on the pad oxide layer as an etching stop layer in the course of manufacturing the cylindrical storage electrode.

Accordingly, to achieve the above objective, there is provided a method for manufacturing a cylindrical storage electrode of a semiconductor device including the steps of (a) forming a contact pad to be connected to an active region of a semiconductor substrate in an interlayer insulator film on the semiconductor substrate, (b) forming a silicon nitride layer as an etching stop layer on the contact pad, (c) forming an insulating layer on the silicon nitride layer, (d) exposing a portion of the surface of the silicon nitride layer by partially removing the insulating layer, (e) removing the exposed portion of the silicon nitride layer using a wet etching process using a predetermined etchant to expose the surface of the contact pad, (f) forming a conductive layer for a storage electrode on the insulating layer and the surface of the exposed contact pad, and (g) completing a cylindrical storage electrode by removing the upper portion of the conductive layer for a storage electrode, the insulating layer and the silicon nitride layer.

The contact pad may be formed of polysilicon.

Preferably, the silicon nitride layer is formed to a thickness of 100 to 500 Å.

In the step (e), the etchant is preferably a phosphoric acid solution and the wet etching process is preferably performed at a temperature of 100 to 170° C. for 4 to 30 minutes.

The conductive layer for a storage electrode may be formed of polysilicon.

The step (f) is preferably performed by deposition.

The step (g) may include the sub-steps of forming a flowable oxide layer on the conductive layer for a storage electrode, partially removing the insulating layer, the conductive layer for a storage electrode and the flowable oxide layer by performing an etch-back process on the entire surface of the resultant structure to expose the insulating layer, and sequentially removing the insulating layer and the silicon nitride layer.

Here, the flowable oxide layer is preferably either an undoped silicate glass (USG) layer or a boron phosphorus silicate glass (BPSG) layer, and the flowable oxide layer is preferably formed by a chemical vapor deposition (CVD) method.

According to the method of the present invention, in order to remove an etching stop layer, e.g., silicon nitride layer, formed on the contact pad, a wet-etching process using a phosphoric acid solution is used. Thus, the silicon nitride layer on the contact pad can be completely removed. Accordingly, the contact area between the contact pad and the storage electrode formed thereon can be maximized.

BRIEF DESCRIPTION OF THE DRAWINGS

The above objective and advantages of the present invention will become more apparent by describing in detail a preferred embodiment thereof with reference to the attached drawings in which.

DESCRIPTION OF THE PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

FIGS. 5 through 10 are cross-sectional views for illustrating a process for forming a cylindrical storage electrode according to the present invention.

Figure 1:
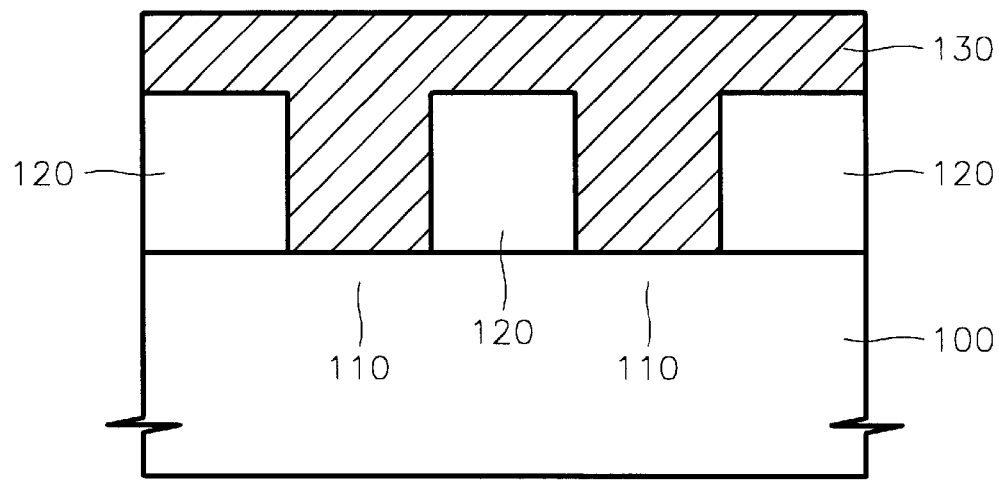
FIGS. 1 through 4 are cross-sectional views for illustrating a process for forming a conventional cylindrical storage electrode.
Figure 2:
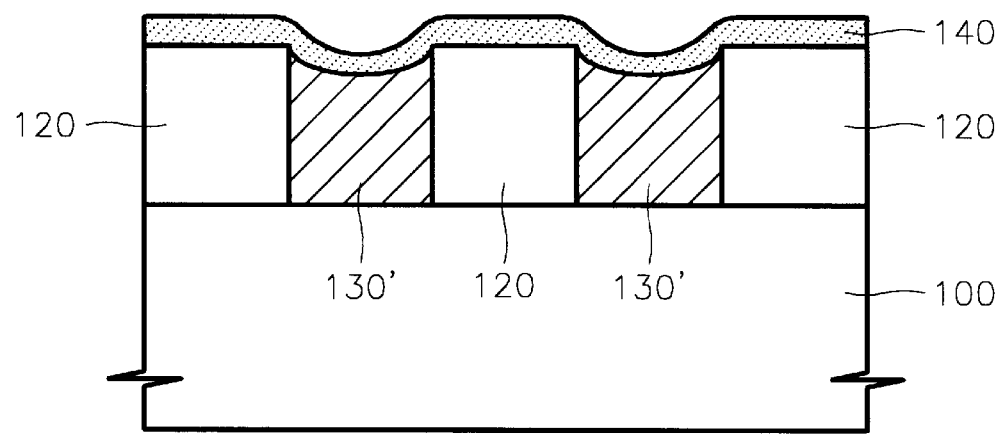
Figure 3:
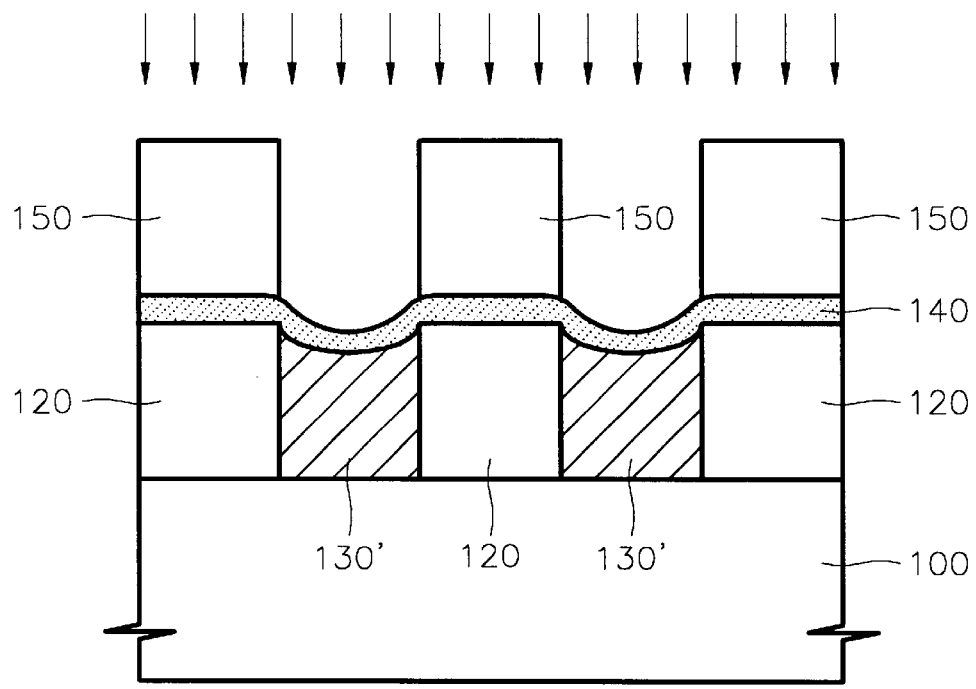
Figure 4:
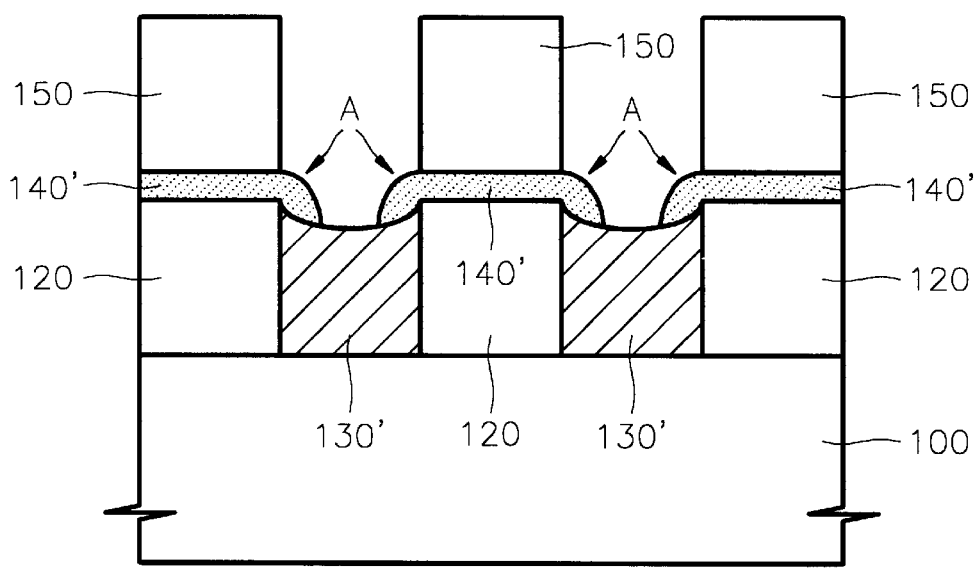
Figure 5:
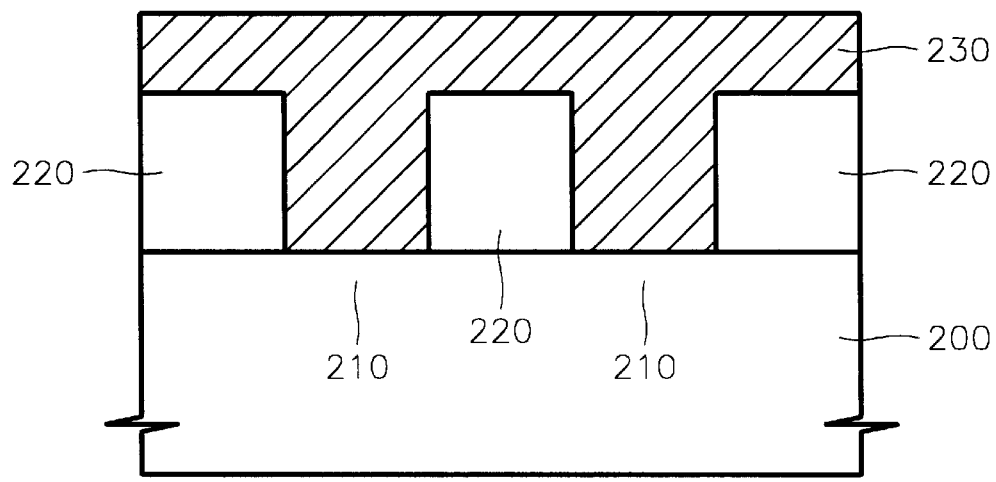
FIGS. 5 through 10 are cross-sectional views for illustrating a process for forming a cylindrical storage electrode according to the present invention.

Referring to FIG. 5, an interlayer insulator film 220 is formed on a semiconductor substrate 200 having active regions 210 defined by isolation regions (not shown). A silicon oxide ($SiO_2$) layer is used as the interlayer insulator film 220. Next, a photoresist layer pattern (not shown) is formed on the interlayer insulator film 220. Then the exposed portions of the interlayer insulator film 220 are etched using the photoresist layer pattern as an etching mask. Then, contact holes are formed to expose the active region 210 of the semiconductor substrate 200. Subsequently, after the photoresist layer pattern is removed, a polysilicon layer is deposited on the resultant structure to completely fill the contact holes so as to form a conductive layer 230 overlying the interlayer insulator film 220.

Figure 6:
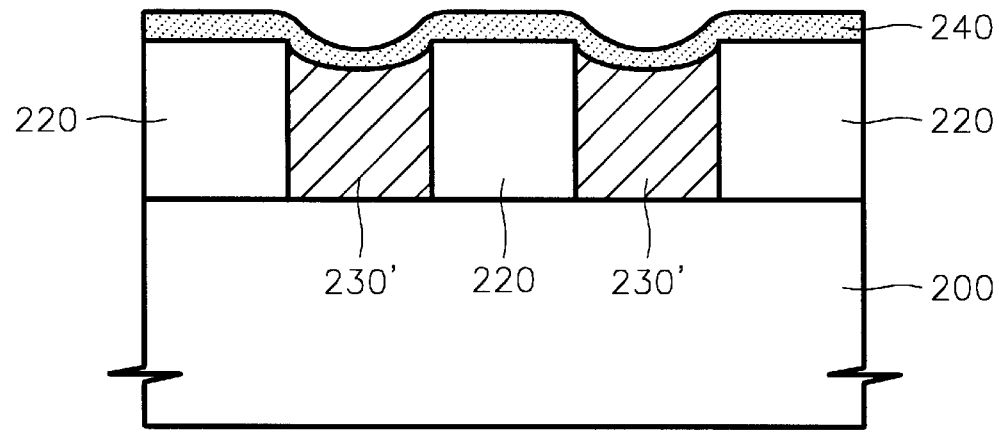

Referring to FIG. 6, the resultant structure shown in FIG. 5 is planarized to form contact pads 230' completely buried in the interlayer insulator film 220. Preferably, the planarization is performed by an etch-back process using a dry etching process until the surfaces of the interlayer insulator film 220 are exposed. Here, after the planarization, the upper surfaces of the contact pads 230' have recesses because of an etching selectivity between the interlayer insulator film 220 and the conductive layer (230 of FIG. 5). Subsequently, an etching stop layer 240 formed of a material such as a silicon nitride ($Si_3N_4$) is formed on the surfaces of the interlayer insulator film 220 and contact pads 230'. Here, the thickness of the silicon nitride layer 240 is in the range of 100 to 500 Å. As described above, since the upper surfaces of the contact pads 230' are recessed, the portions of the silicon nitride layer 240 on the contact pads 230' are slightly recessed while the other portions thereof on the interlayer insulator film 220 are flat.

Figure 7:
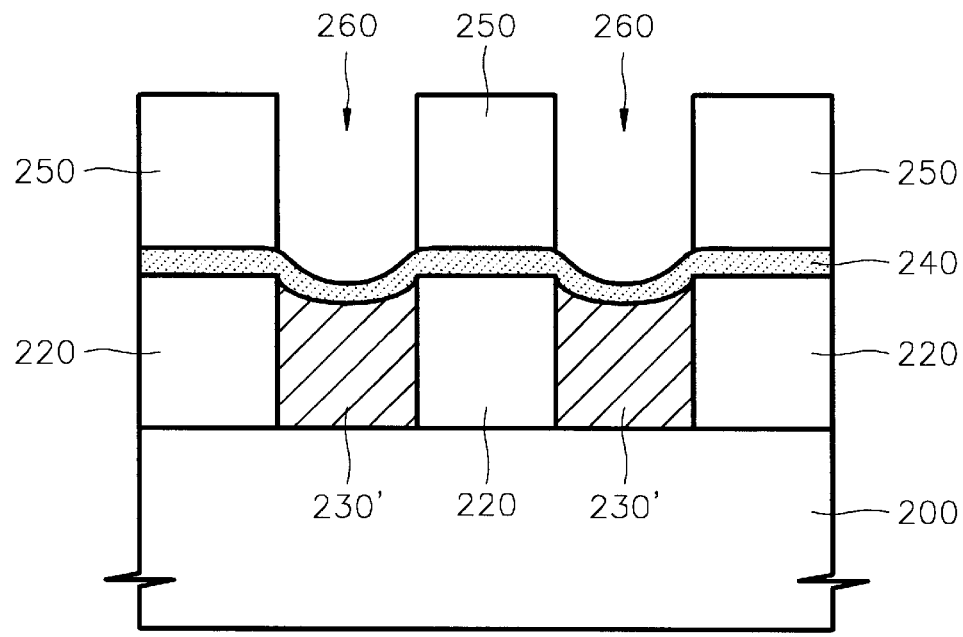

Next, referring to FIG. 7, an insulation layer, for example, an oxide layer 250, is formed on the etching stop layer 240. Then, after a photoresist layer pattern (not shown) is formed on the oxide layer 250, the exposed portions of the oxide layer 250 are etched using the photoresist layer pattern as an etching mask. The etching stops at the etching stop layer 240. As a result, openings 260 that expose the surfaces of the etching stop layer 240 corresponding to the surfaces of the contact pads 230' are formed in the oxide layer 250. After the openings 260 are formed, the photoresist layer pattern is removed.

Figure 8:
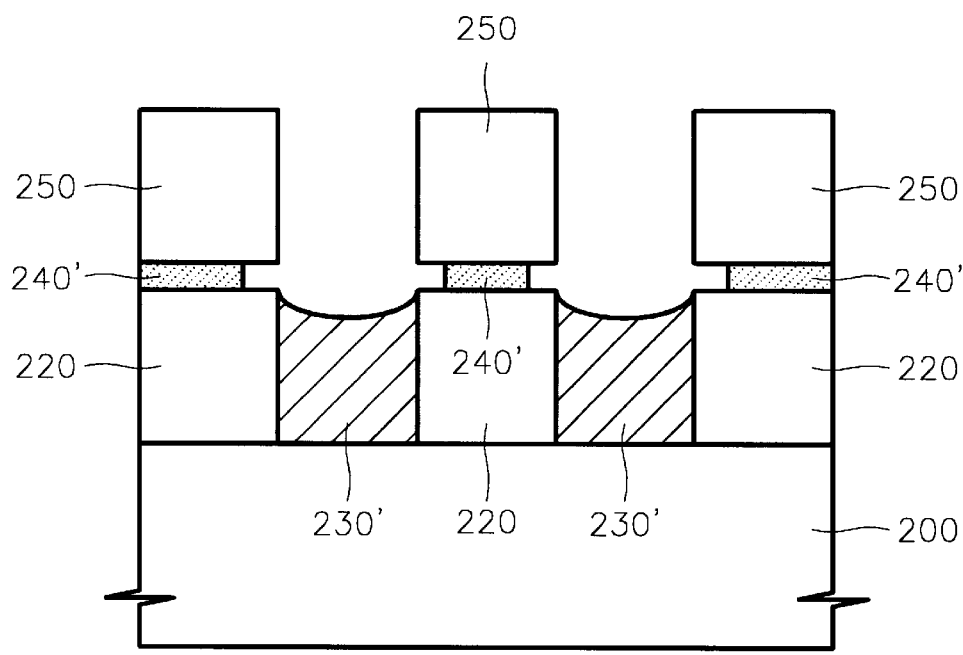

Referring to FIG. 8, importantly, the exposed portions of the etching stop layer (240 of FIG. 7) are removed by using a wet etching process. A phosphoric acid ($H_3PO_4$) solution is used as a wet etchant. In some cases, a HF solution may be used as a wet etchant. However, if the concentration of the HF solution used as the etchant is high, the contact pads 230' formed of polysilicon may be attacked by the etchant. Since the wet etching process is anisotropically performed, the exposed portions of the etching stop layer (240 of FIG. 7) are removed. Further, the portions of the etching stop layer 240 under the oxide layer 250 are also partially removed during the wet etching process, forming an undercut therein. Thus, if the wet etching process using the phosphoric acid solution is excessive, the oxide layer 250 may be lifted, and a bridge phenomenon, in which a storage electrode to be formed in a subsequent step contacts an adjacent storage electrode, may occur. Therefore, preferably, the wet etching process using the phosphoric acid solution is performed at a temperature of 100 to 170° C. for 4 to 30 minutes so that the oxide layer 250 is not lifted and the bridge phenomenon does not occur.

Figure 9:
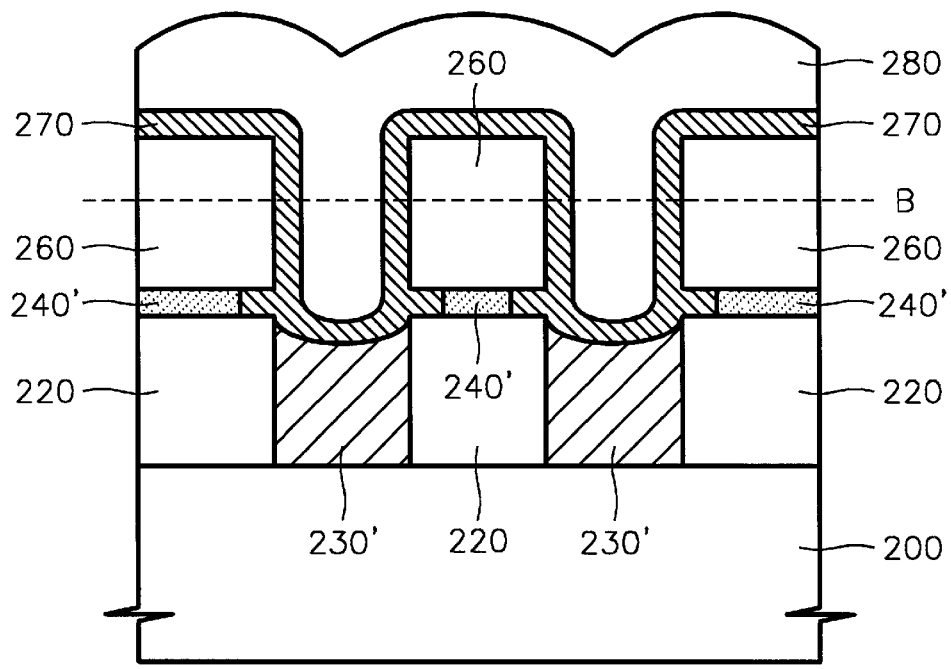
Figure 10:
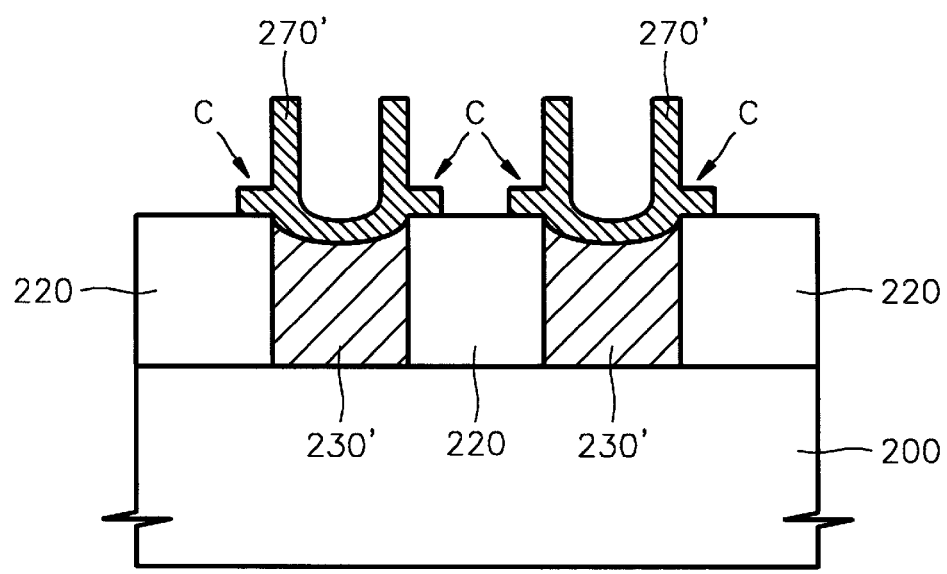

Next, referring to FIG. 9, a polysilicon layer 270 to be used as a storage electrode is formed on the resultant structure shown in FIG. 8. The polysilicon layer 260 is formed using conventional techniques such as a chemical vapor deposition (CVD) method. Then, a flowable oxide layer 280 such as an undoped silicate glass (USG) layer or a boron phosphorus silicate glass (BPSG) layer is formed on the resultant structure by conventional techniques such as CVD. The flowable oxide layer 280 is formed to prevent the bottom surface of the polysilicon layer 260 from being removed in a subsequent step of removing the oxide layer 250. Subsequently, the oxide layer 250, the polysilicon layer 270 and the flowable oxide layer 280 are partially removed, preferably, by a dry etching process. Here, the drying etching process is performed down to a portion indicated by a dotted line (B) shown in FIG. 9. Then, the remaining portions of the oxide layer 250 are removed, preferably, using a wet etching process. Next the etching stop layer 240' is removed. Consequently, as shown in FIG. 10, cylindrical storage electrodes 270' contacting the contact pads 230' are completed. In FIG. 10, protrusions indicated by a mark "C" in the cylindrical storage electrode 270' are formed because of the under-cut formed during removal of the etching stop layer 240' as illustrated in FIG. 8. Consequently, the surface areas of the storage electrodes are further increased.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for manufacturing cylindrical storage electrodes of a semiconductor device, comprising:
   (a) forming contact pads connected to active regions of a semiconductor substrate in a first insulating layer on the semiconductor substrate;
   (b) forming an etching stop layer on the contact pads;
   (c) forming a second insulating layer on the etching stop layer;
   (d) selectively removing the second insulating layer to expose portions of the surface of the etching stop layer;
   (e) wet-etching the exposed portions of the etching stop layer disposed on the contact pads to expose the surface of the contact pads using a predetermined etchant;
   (f) forming a conductive layer for a storage electrode on the second insulating layer and the surface of the exposed contact pads, the conductive layer comprising an upper portion and a lower portion; and
   (g) removing the upper portion of the conductive layer, the second insulating layer and the etching stop layer to form cylindrical storage electrodes being electrically isolated from each other.

2. The method according to claim 1, wherein the contact pads are formed of polysilicon.

3. The method according to claim 1, wherein the etching stop layer is formed to a thickness of approximately 100 to 500 Å.

4. The method according to claim 1, wherein in the step (e), the etchant is a phosphoric acid solution.

5. The method according to claim 1, wherein in the step (e), the wet etching process is performed at a temperature of approximately 100 to 170° C.

6. The method according to claim 1, wherein in the step (e), the wet etching process is performed for approximately 4 to 30 minutes.

7. The method according to claim 1, wherein the conductive layer for a storage electrode is formed of polysilicon.

8. The method according to claim 1, wherein the step (f) is performed by deposition.

9. The method according to claim 1, further comprising, forming a flowable oxide layer on the conductive layer, wherein the step (g) comprises the sub-steps of:
   etching back the resultant structure to remove a portion of the flowable oxide layer and the upper portion of the conductive layer, thereby exposing the second insulating layer; and
   removing the second insulating layer, the remaining portion of the flowable oxide layer, and the etching stop layer.

10. The method according to claim 9, wherein the flowable oxide layer is either an undoped silicate glass (USG) layer or a boron phosphorus silicate glass (BPSG) layer.

11. The method according to claim 9, wherein the flowable oxide layer is formed by a chemical vapor deposition (CVD) method.

12. The method according to claim 1, wherein said wet etching is performed under predefined conditions in such manner as not to lift the second insulating layer.

13. The method according to claim 1, wherein said wet etching is performed under such predefined conditions so as to form an undercut in the etching stop layer beneath the second insulating layer.

14. The method according to claim 1, wherein said etching stop layer is formed of silicon nitride.

* * * * *